(12) United States Patent
Chen et al.

(10) Patent No.: US 6,269,374 B1
(45) Date of Patent: Jul. 31, 2001

(54) METHOD AND APPARATUS FOR UPDATING CHECKSUMS OF DATA STRUCTURES

(75) Inventors: Chiahong Chen, Oro Valley; Mark Edward Hill, Tucson, both of AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/084,533

(22) Filed: May 26, 1998

(51) Int. Cl.$^7$ .................................................. G06F 17/30
(52) U.S. Cl. ............................ 707/100; 705/51; 707/200; 709/235; 709/247; 711/163; 713/1; 713/111; 713/323
(58) Field of Search ..................................... 707/100, 101, 707/102, 10, 200, 103; 709/235, 223; 705/51; 710/10; 711/163; 713/1, 323, 111

(56) References Cited

U.S. PATENT DOCUMENTS

| | | | |
|---|---|---|---|
| 5,022,077 | * 6/1991 | Bealkowski et al. ................ | 711/163 |
| 5,111,465 | 5/1992 | Edem et al. ......................... | 714/808 |
| 5,128,995 | * 7/1992 | Arnold et al. ....................... | 713/1 |
| 5,239,640 | 8/1993 | Froemke et al. ..................... | 714/1 |
| 5,551,043 | * 8/1996 | Crump et al. ....................... | 713/323 |
| 5,659,801 | 8/1997 | Kopsaftis ............................. | 710/62 |
| 5,666,411 | * 9/1997 | McCarthy ............................ | 705/51 |
| 5,682,550 | * 10/1997 | Brown et al. ....................... | 710/10 |
| 5,684,944 | 11/1997 | Lubbers et al. ..................... | 714/6 |
| 5,701,316 | 12/1997 | Alferness et al. ................... | 714/807 |
| 5,768,426 | * 6/1998 | Rhoads ............................... | 382/232 |
| 5,778,395 | * 7/1998 | Whiting et al. ..................... | 707/204 |
| 5,806,073 | * 9/1998 | Piaton ................................. | 707/200 |
| 5,832,235 | * 11/1998 | Wilkes ................................ | 709/247 |
| 5,850,562 | * 12/1998 | Crump et al. ....................... | 713/1 |
| 5,978,475 | * 11/1999 | Schneier et al. .................... | 713/177 |
| 6,052,733 | * 4/2000 | Mahalingam et al. ............... | 709/235 |
| 6,094,654 | * 7/2000 | Van Huben et al. ................. | 707/8 |
| 6,169,992 | * 1/2001 | Beall et al. ......................... | 707/103 |
| 6,185,567 | * 2/2001 | Ratnaraj et al. .................... | 707/10 |
| 6,195,664 | * 2/2001 | Tolfa .................................. | 707/200 |

FOREIGN PATENT DOCUMENTS 8-339309   12/1996   (JP) .

OTHER PUBLICATIONS

Bright, Jonathan D. et al., "Checking the Integrity of Trees", Digest of Pepe, Twenty–Fifth International Symposium on Fault–Tolerant Computing, Jun. 27–30, 1995, FTCS–25, pp. 402–411.*

Drechsler, R., "Checking Integrity during Dynamic Reordering in Decision Diagrams", Proceedings of the 25th EUROMICRO Conference, Sep. 8–10, 1999, vol. 1, pp. 360–367.*

McAuley, A. J., "Weighted Sum Codes for Error Detection and Their Comparison with Existing Codes", IEEE/ACM Transactions On Networking, vol. 2, No. 1, Feb. 1994, pp. 16–22.*

IBM Technical Disclosure Bulletin, 37(11):469–471 (Nov. 1994).

* cited by examiner

Primary Examiner—Hosain T. Alam
Assistant Examiner—Shahid Alam
(74) Attorney, Agent, or Firm—Altera Law Group, LLC

(57) ABSTRACT

A method and apparatus for updating a checksum of a data structure wherein the checksum has an additive property. According to the invention, a word value of a word that is to be modified is eliminated from a checksum to form a current checksum. The current checksum is then updated with a modified word value of a modified word. A system for data structures includes a computer readable and writeable medium and a processor which performs the method of the invention.

37 Claims, 7 Drawing Sheets

METHOD AND APPARATUS FOR UPDATING CHECKSUMS OF DATA STRUCTURES

BACKGROUND OF THE INVENTION

1. Field of the Invention

This invention relates in general to controlling data structure integrity and, more particularly, to calculating checksums for data structures.

2. Background of the Invention

Whenever information is stored and/or transmitted electronically, it is of great importance to control the integrity of the data structure that contains the information. Both during storage and transmission, the data structure is subject to potential influence of errors. The physical devices which store or transmit the information are subject to physical and mechanical failure which in turn can lead to the introduction of errors in the data structure, or potentially a total loss of the information in the data structure.

A particularly important area where the control of data integrity requires powerful means and methods in order to be a critical safeguard against errors is the massive data backups used by financial enterprises such as credit card companies, banks, etc. The vast number of transactions in a day necessitates frequent updating of large data structures, and corresponding data integrity control.

It is possible to control the integrity of the data structures by always keeping a duplicate of the information in the data structure stored in another device. The integrity of the data structure can then always be controlled by comparing the data structure to the ones stored in the duplicate device. Obviously, a great disadvantage of this method is the increased storage capacity that must be accessible instantly upon changing the data structure, and the additional time and computer capacity needed.

Checksums have become a common tool used in controlling the integrity of data structures. Checksums are used in a variety of different areas within information technology. Typically, checksums are used in the following way. An application which handles information in the form of data structures calculates a checksum for a particular data structure. The checksum is calculated using the data stored in the data structure, and thus becomes a mathematical "fingerprint" of the particular data in the data structure. Whenever the application needs to control and confirm the integrity of the data structure, the application calculates the checksum again, using the same method of calculating as was used previously, and then compares the newly calculated checksum with the original checksum which was stored in the data structure. If the integrity of the data structure is intact, the checksums will be identical. Any discrepancy between the two checksums is a clear indication that a data integrity problem has occurred in the data structure. It is noted that checksum calculation is typically "transparent" to users of the data structures, which means that the user is normally not aware of checksum calculations—they are performed without particular inputs or outputs via the user interfaces—unless a data integrity problem is detected, at which the user should be notified or alerted.

The checksum for a data structure must always be updated when modifications of the data in the data structure have taken place. Previously, the updating of the checksum has been carried out in the following way. Before any changes are made in an existing data structure, the application will control and confirm the integrity of the data structure by calculating a checksum and comparing it to a stored checksum, as described above. If the comparison indicates that the integrity is intact, the changes in the data structure can be made. When the data structure has been modified as desired, the application must update the checksum to reflect the data structure including the changed data. The application calculates a new checksum for the modified data structure and stores that checksum in the data structure.

If the modified data structure contains substantially as much information as the original data structure, the second calculation takes approximately as much time to perform as did the first calculation. This approximation is valid regardless of whether a small or large portion of the data were altered during the change and also regardless of whether the data structure includes only a few bytes or several gigabytes.

It can be seen that there is a need for a method and apparatus for updating checksums of data structures that does not recalculate checksum contributions from parts of the data structure that were not changed.

SUMMARY OF THE INVENTION

To overcome the limitations in the prior art described above, and to overcome other limitations that will become apparent upon reading and understanding the present specification, the present invention discloses a method and apparatus for updating checksums.

The present invention solves the above-described problems by providing a method of updating a checksum of a data structure wherein the checksum has an additive property. The method includes eliminating from a checksum a word value of a word that is to be modified, to form a current checksum. The current checksum is then updated with a modified word value of a modified word, to form an updated checksum.

An article of manufacture in accordance with the principles of the invention includes a computer readable medium having instructions for causing a computer to perform the method of invention.

A system in accordance with the principles of the present invention includes a computer readable and writeable medium comprising at least one data structure, and a processor which performs the method of the invention.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of preferred embodiments, reference is made to the accompanying drawings which form a part hereof and in which is shown by illustration specific embodiments in which the invention may be practiced. It is to be understood that other embodiments may be utilized and structural changes may be made without departing from the scope of the present invention.

The present invention provides a method of updating checksums of data structures. The method may be performed, for example, by a computer reading instructions from a computer readable medium. Many different kinds of computers, including varying hardware environments, can be used to perform the method of the invention, for example the hardware environment described below.

Figure 1:
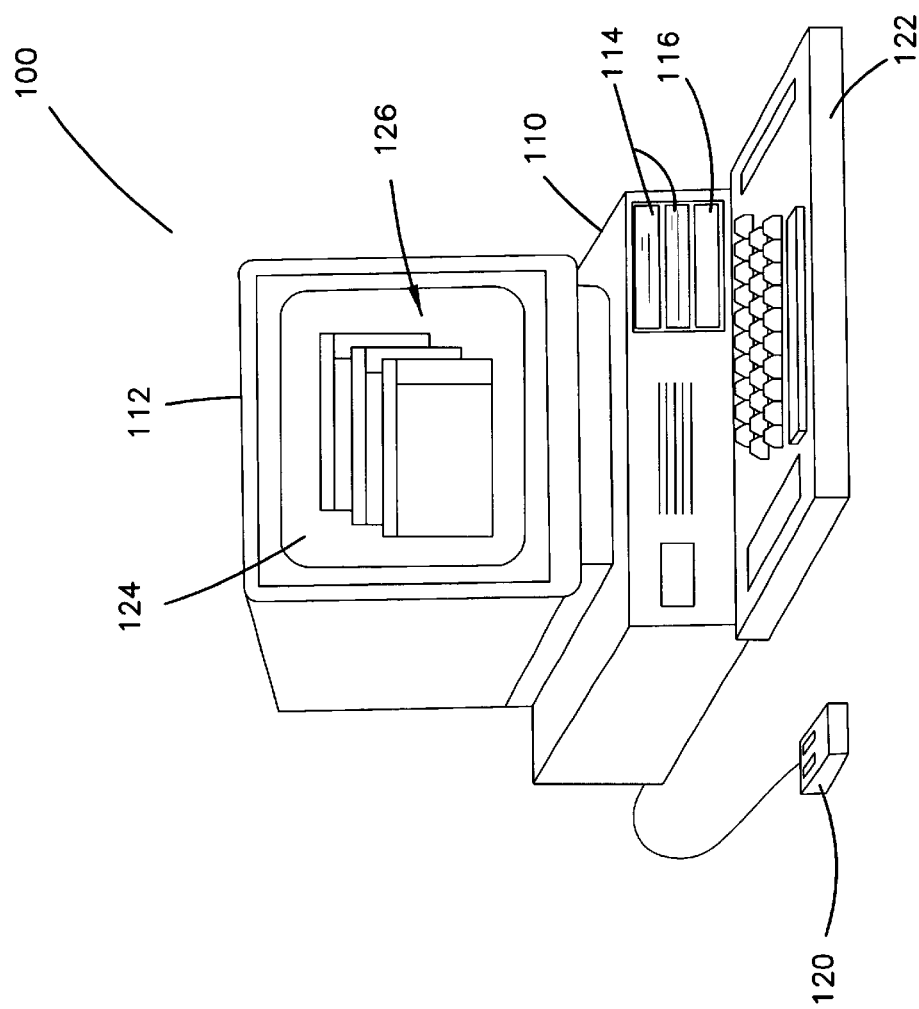
FIG. 1 is a block diagram illustrating an exemplary hardware environment of the present invention.

FIG. 1 is a block diagram that illustrates an exemplary hardware environment for the method according to the present invention. The present invention is typically implemented using a computer 110 comprised of a microprocessor, random access memory (RAM), read-only memory (ROM), and other standard components. It is envisioned that attached to the computer 110 may be a monitor 112, floppy disk drives 114, CD-ROM drives 116. Also included in the preferred embodiment may be input devices, for example, a mouse pointing device 120 and a keyboard 122.

The computer 110 operates under the control of an operating system 124, such as the Windows, OS/2, Macintosh, or UNIX operating systems, which is represented in FIG. 1 by the screen display on the monitor 112. The computer 110 executes one or more computer programs 126, which are represented in FIG. 1 by the "windows" displayed on the monitor 112, under the control of the operating system 124. The present invention comprises a checksum calculation function that is preferably implemented in the operating system 124 and/or computer programs 126.

Generally, the operating system 124 and the computer programs 126 may be tangibly embodied in a computer-readable medium or carrier, e.g. one or more of the fixed and/or removable data storage devices 114 and 116, or other data storage or data communications devices. Both the operating system 124 and the computer programs 126 may be loaded from the data storage devices 114 and 116 into the random access memory of the computer 110 for execution by the microprocessor as discussed above with reference to FIG. 1. Both the operating system 124 and the computer programs 126 comprise instructions which, when read and executed by the microprocessor of the computer 110, causes the computer 110 to perform the steps necessary to execute the steps or elements of the present invention.

Although an exemplary computer system configuration is illustrated in FIG. 1, those skilled in the art will recognize that any number of different configurations performing similar functions may be used in accordance with the present invention.

The data structures referred to in this description are typically stored as digital information on a computer readable and writeable medium. Many different storage mediums, such as magnetic tape and discs may be used with the invention. The data structure consists of one or more bytes of information stored on the medium. Typically, a data structure may consist of from several thousand to many million or billion bytes, depending on the application in which the invention is used. Below is a schematic description of how a data structure is divided into a number of words.

Figure 2:
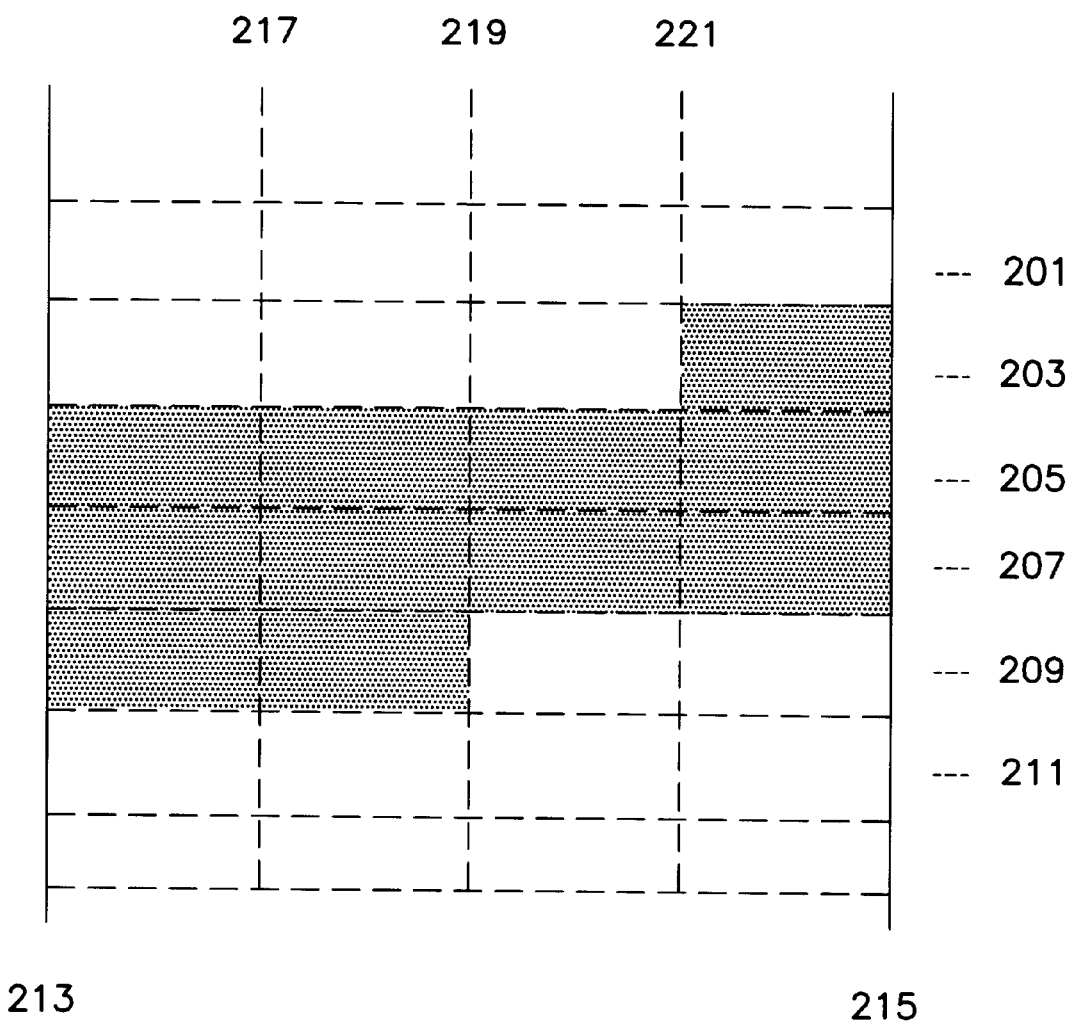
FIG. 2 is a diagram schematically illustrating a data structure divided into words.

FIG. 2 schematically shows a part of a storage medium with a shaded area representing a data structure. The storage medium may include many data structures, only one of which is shown. The storage medium is divided into a number of words. The words are confined by the word boundaries 213 and 215 such that the words are formed as rows between the word boundaries 213 and 215. The words 201, 203, 205, 207, 209 and 211 are shown in the drawing and, in this example, the words each consist of four bytes. The bytes are separated by the boundaries 217, 219 and 221. No part of the shaded area representing the data structure lies within word 201, and consequently word 201 is not included in a calculation of a checksum for the data structure. If the words are read consecutively from top to bottom, the data structure can be described as beginning at the boundary 221 in word 203 and ending at the boundary 219 in word 209. The data structure in FIG. 2 neither begins nor ends at one of the word boundaries 213 and 215. Accordingly, when using a checksum algorithm that uses words, the extra bytes in the words containing the beginning and end of the data structure must be accounted for. In this example, the extra bytes are the bytes prior to boundary 221 in word 203 and the bytes after boundary 219 in word 209. These parts of words 203 and 209 may, for example, contain information that belongs to different data structures. The number of bytes in a data structure does not have to be a multiple of the number of bytes in a word. For example, the data structure in FIG. 2 consists of 11 bytes, which is not a multiple of 4, the number of bytes in a word.

Figure 3:
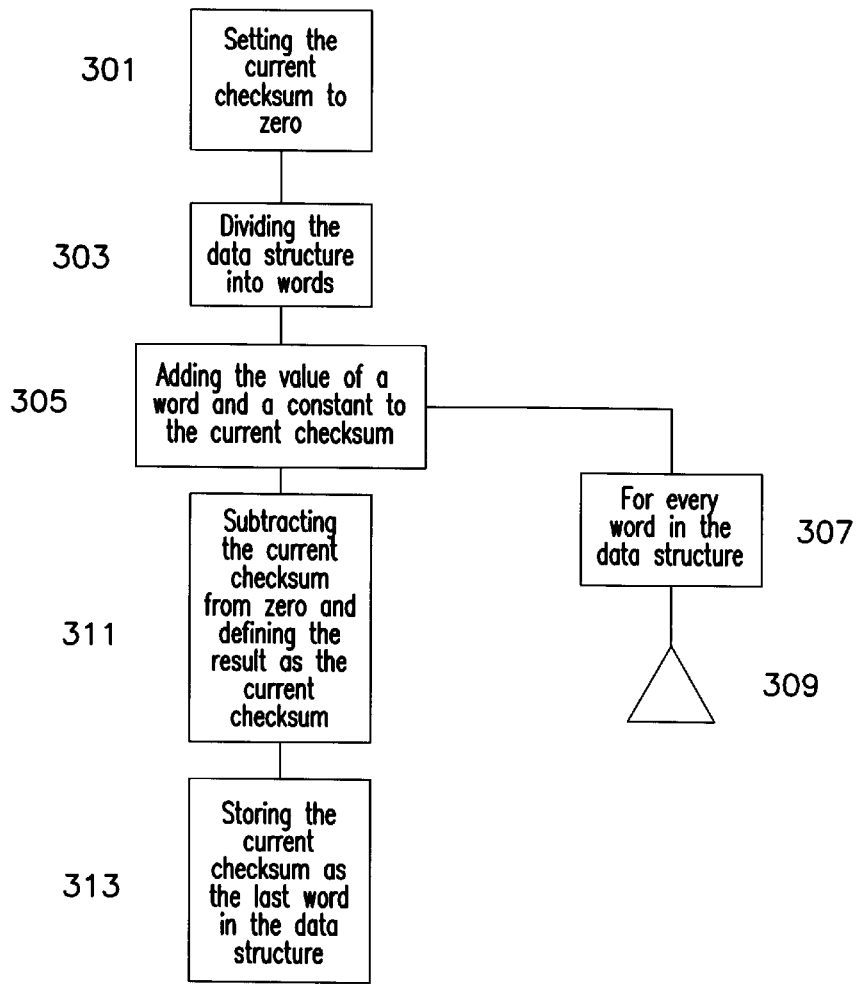
FIG. 3 is an exemplary flowchart for calculating a checksum for a data structure.

An exemplary method for calculating a checksum of a data structure is illustrated in FIG. 3. The checksum is typically calculated immediately after the data structure has been created or modified The calculated checksum will be stored in association with the data structure. When the data structure is accessed at a later time, a new checksum is typically calculated and compared with the stored checksum to control the integrity of the data structure. In step 301, the variable "current checksum" is set to zero. The current checksum variable will be used throughout the iterative process of calculating the checksum.

In step 303, the data structure is divided into words containing a specific number of bytes each. For example, the data structure may be divided into words containing four bytes each. As was discussed above, the beginning and end of the data structure may or may not coincide with beginnings or ends of words, respectively. In a simple example, the data structure may be entirely confined within one word, but typically the data structure will consist of a great number of words.

Steps 305, 307 and 309 illustrate an iterative process where the values of words are added to calculate the checksum. Beginning with the first word in the data structure, the value of the word and a constant is added to the current checksum. In accordance with the above, the current checksum has the initial value zero the first time step 305 is performed. Steps 307 and 309 indicate that the calculation of step 305 is repeated for every word in the data structure. In further accordance with the above, this means that the iterative process is repeated for every word that at least partly belongs to the data structure. The constant that is added to the current checksum with every word value may be chosen depending on the particular application. The constant is added with each word value to provide an element of secrecy to the checksum calculation. It is more difficult for an unauthorized person to use the calculated checksum value if he or she does not know the exact value of the constant that is added with each word value. For example, an unauthorized person who gains access to a data structure and obtains the checksum value of the data structure, cannot control the integrity of the data structure by calculating a new checksum unless he or she knows the exact value of the constant that was added in calculating the original checksum for the data structure. During the checksum process, an overflow condition is likely to happen when adding words for the checksum. The algorithm may or may not ignore the checksum, and may or may not use the overflow condition as a part of the algorithm. When all words that contain information belonging to the data structure have been added to the current checksum, the iterative process of steps 305, 307 and 309 is complete.

In step 311, the current checksum value is subtracted from zero and the result is defined as the current checksum. Subtracting the current checksum value from zero before storing the value may be convenient, for example, when the integrity of the data structure is later controlled. When a new checksum is calculated for the data structure, it can simply be added to the stored checksum value for the data structure. If the result of the addition is zero, the integrity of the data structure is intact, otherwise a data integrity problem has occurred.

In step 313, the thus calculated value of the current checksum is stored as the last word in the data structure. By storing the checksum in the data structure, it will be accessible at future times when the integrity of the data structure is controlled. The exact location of the checksum variable in the data structure can vary, but typically it is stored as the last word in the data structure.

When a checksum has been calculated as described above and stored in association with a data structure, the checksum value remains accurate as long as no changes are made in the data structure. If the data structure or a part of it is changed, the checksum value must be updated. Before changes are made in a data structure, it is preferable to control the integrity of the data structure. This can be carried out, for example, as described above.

Figure 4:
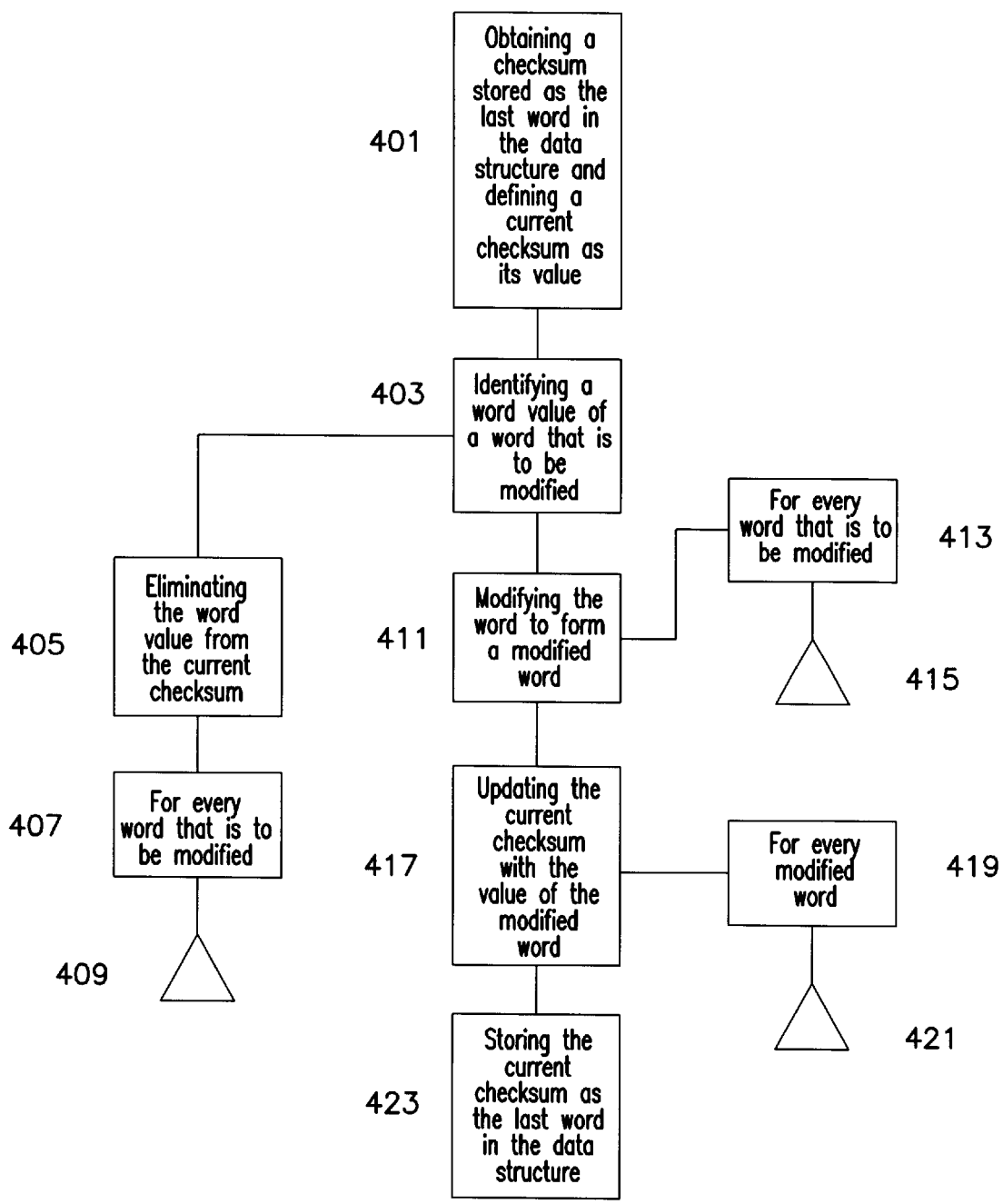
FIG. 4 is a flowchart for updating a checksum of a modified data structure in accordance with one embodiment of the invention.

FIG. 4 is a flow chart illustrating a method for updating a checksum after the data structure or a part of it has been changed. The method may be used with any checksum calculated using a checksum calculating method that is independent of the particular order in which the elements are associated to form the checksum. For example, the calculating method typically has an additive property.

In step 401, a checksum stored in the data structure is obtained and its value is given to a variable "current checksum". The current checksum will be used to hold the momentary value of the checksum while it is being updated.

In step 403 the word value of a word that is to be modified is identified. Similarly to the above discussion regarding the beginning and end of a data structure, a word is considered to be a "word that is to be modified" if only a part of the word is to be modified. Using the schematic illustration in FIG. 2 as an example; if only the information after the boundary 221 in word 203 were to be changed, the word value of word 203 would be identified as that of a word that is to be modified. The thus identified word value is eliminated from the current checksum in step 405. Steps 407 and 409 indicate that the steps of identifying the word value and eliminating the word value from the checksum are repeated for every word that is to be modified in the data structure.

Figure 5:
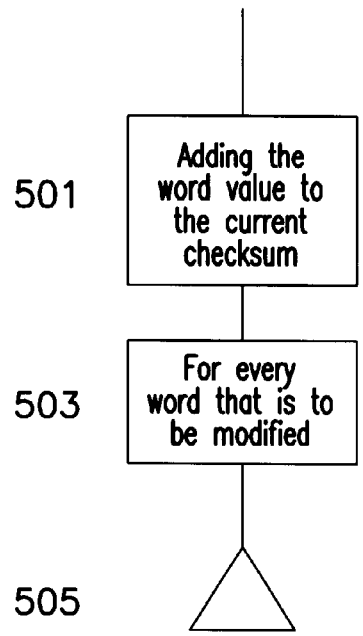
FIG. 5 is a step of a second embodiment of the method of updating a checksum in accordance with the invention.

If, for example, the checksum was originally calculated using a method equivalent to the one illustrated in FIG. 3, eliminating the word value from the checksum would include adding the word value to the current checksum. Adding the word value eliminates its contribution to the checksum because the checksum was formed by subtracting a calculated checksum from zero. This particular case may be illustrated as step 501 in FIG. 5, in which the word value is added to the current checksum, whereby its contribution to the checksum is eliminated. Similarly, if the original checksum was calculated without subtracting from zero, the word value could be eliminated from the checksum by subtracting it from the checksum. Steps 503 and 505 indicate that the steps of identifying the word value and eliminating the word value from the checksum are repeated for every word that is to be modified in the data structure.

When every word that is to be modified has been accounted for by eliminating its word value, the iterative process of steps 403, 405, and 407 is complete. The value of the current checksum at this point will have no contribution from any words that are to be modified in the data structure.

In steps 411, 413 and 415, a field in the data structure is modified, forming modified words in the data structure. The step of modifying is repeated for every word that is to be modified. In step 411 the first word is modified to form a modified word and steps 413 and 415 indicate that step 411 is performed for every word that is to be modified.

Figure 6:
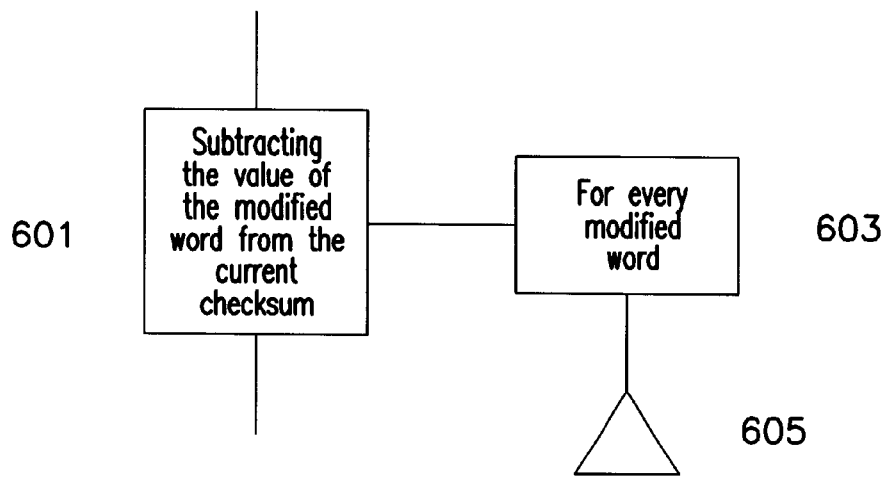
FIG. 6 is further steps in the second embodiment of the method of updating the checksum in accordance with the invention.

In step 417 the current checksum is updated with the value of the modified word. Steps 419 and 421 indicate that the step of updating is carried out for every modified word in the data structure. If the original checksum was calculated substantially as described with regard to FIG. 3 above, the value of the modified word is subtracted from the current checksum to update the current checksum. Subtracting the word value contributes to the checksum because the checksum was formed by subtracting a calculated checksum from zero. With this example, the step of updating would be carried out as illustrated in FIG. 6, where step 601 includes the subtracting of the modified-word value from the current checksum. Steps 603 and 605 indicate that step 601 is performed for every modified word. When the current checksum has been updated for every modified word, the iterative process is complete. At this point, the current checksum is the fully updated checksum for the modified data structure, and it is an accurate representation of the data structure as modified, which may be used to control the integrity of the modified data structure. In step 423 the current checksum is stored as the last word in the data structure. As described above, the current checksum may be stored in various locations in association with the data structure, for example at the end of it.

Using the above process, the checksum can be expediently updated when changes have been made in the data structure. The method updates the checksum with modified word values, without recalculating the word values of words in the data structure that were not changed.

An example of the use of an embodiment of the invention will now be given. The time for updating the checksum of a data structure was measured in two exemplary runs. In both runs, the size of the data structure was 17 KB and the size of the altered field in the data structure was one byte.

The microprocessor was an Intel®80960 CA operating at 33 MHz. In the first run, the checksum was updated using the method outlined in the Background of the Invention. The method is characterized in that it recalculates the contribution from all fields in the data structure, regardless of how many fields were changed. In the second run, the checksum was updated using the method according to the invention. The results of the two exemplary runs are presented in Table 1 below.

TABLE 1

| Run Number | Data Structure | Changed Field | Time to Update Checksum |
|---|---|---|---|
| 1 | 17 KB | 1 byte | 9396 $\mu s$ |
| 2 | 17 KB | 1 byte | 3240 $\mu s$ |

In this example, the invented method reduced the checksum updating time to about 33% of the time needed with the previous method. It is noted that updating the checksum after a 1-byte field change is the fastest operation. It is also noted that these results are exemplary only, and that different results may be obtained with other implementations of the invention, such as by using other computer hardware and data structure characteristics.

Figure 7:
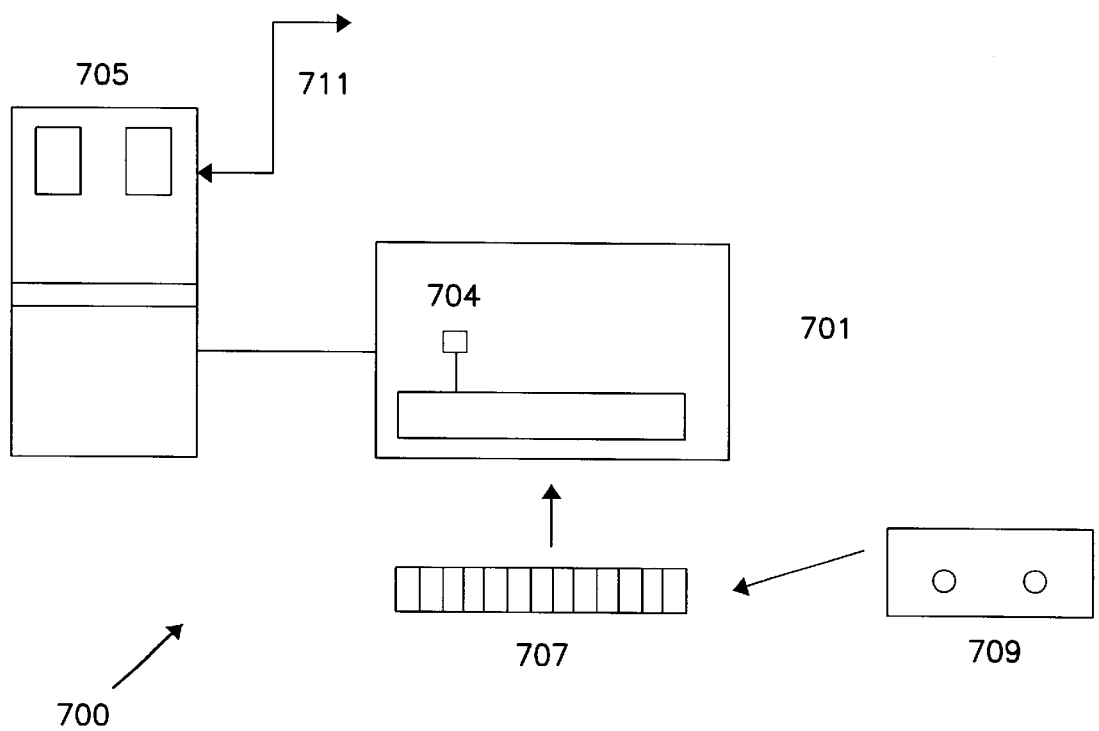
FIG. 7 is an embodiment of a system in accordance with the invention.

As noted above with respect to FIG. 1, the present invention may be implemented using a variety of different hardware environments. Further examples of such hardware environments will now be given. FIG. 7 is a system for data structures. The system includes a data access device 701. The device 701 can read and write information that is stored on computer readable and writeable medium. Many different computer readable and writeable mediums can be used. For example, computer readable and writeable mediums such as compact disks, hard disks, floppy disks, etc. may be used with many applications. In this embodiment, the computer readable and writeable medium includes a tape cartridge 709. The tape cartridge 709 typically contains magnetic tape. A number of tape cartridges 709 may be grouped together to form a magazine 707 with increased storage capacity. One or more magazines 707 may be brought in connection with the device 701, whereby the device 701 can access the information stored on the medium in the magazine 707. Many different data access devices may be used as the device 701. For example, compact disk devices, floppy drives, hard drives, etc., may be used with many applications. In the illustrated embodiment, the device 701 is a tape drive. For example, a tape drive such as the Magstar MP Tape Subsystem Model 3570 or 3590 manufactured by IBM may be used with embodiments of the invention.

Device 701 includes a processor 704 which can access the medium of magazine 707 when it is connected to the device 701. The processor 704 includes logic and can perform algorithms suitable for the application. In particular, the processor 704 performs a method in accordance with the present invention. The processor 704 may perform the method for example by receiving instructions provided to it from the outside, for example via the controller 705, or a network or the Internet. Alternatively, the processor 704 may perform the method by reading instructions from a computer readable medium. Many different kinds of computer readable mediums may be used with this application. For example, the instructions may be located on a computer chip, a floppy disk, hard drive, compact disk, or magnetic tape.

The device 701 may be connected to a controller 705. The controller 705 controls the device 701 including the processor 704. Many different controllers may be used as the controller 705. The controller 705 includes logic and can perform algorithms suitable for the application. For example, those skilled in the art will recognize that a computing system such as the AS/400 manufactured by IBM may be used with this and other embodiments. However, the invention is not limited to any particular hardware embodiment. The controller 705 may have an interface 711 whereby a user can give instructions to the controller 705 and receive output information from the controller 705 regarding, for example, the information stored in the tape cartridges 709. When a data structure on the tape cartridge 709 has been changed, the processor 704 can update the checksum of the data structure.

Figure 8:
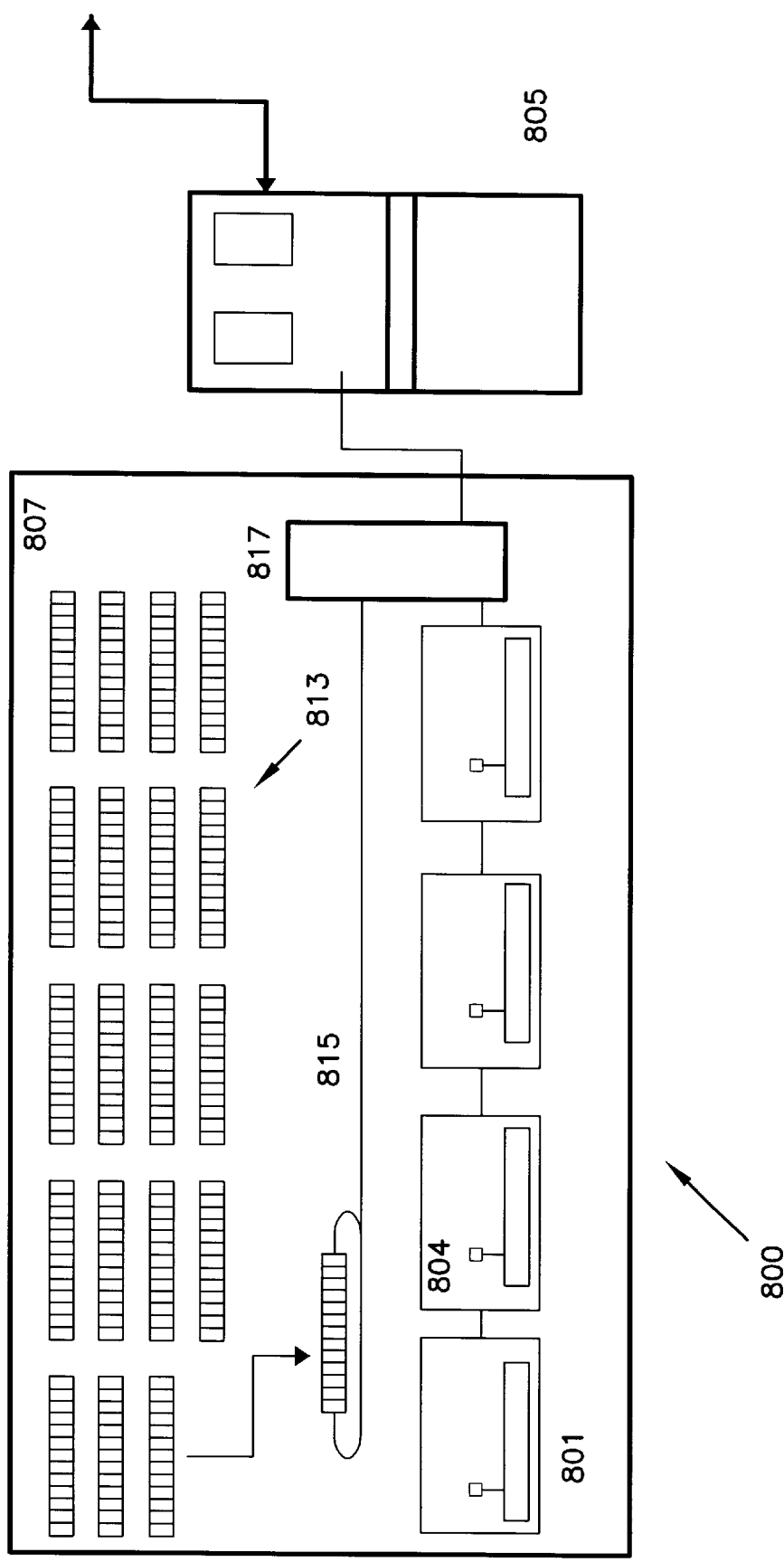
FIG. 8 is a second embodiment of the system in accordance with the invention.

FIG. 8 shows an embodiment of a system 800 according to the invention. The system 800 includes a computer medium library 801. The computer medium is located in a number of medium magazines 807 stacked in a medium array 813. Many different kinds of computer readable and writeable medium can be used in the magazines 807, for example those described above with regard to magazine 707, such as magnetic tape stored in cartridges.

The medium magazines 807 can be brought in connection with any one of a number of data access devices 801 which are also located in the computer medium library 801. The devices 801 can read and write information that is stored on computer readable and writeable medium, for example in the magazines 807. The devices 801 include a processor 804 which can update a checksum in accordance with the invention, by receiving instructions from outside it or by accessing instructions located inside device 801. For example, the device 801 may include computer readable medium that has instructions for the processor 804 to update a checksum. Many different computer readable medium may be used with embodiments of the invention, for example as described above with regard to the processor 704 in device 701.

The magazines 807 can be located, moved, and brought in connection with any one of the devices 801 by a magazine accessor 815. The magazine accessor 815 may, for example, be a robot which can identify and relocate any of the magazines 807 in the computer medium array 813. The robot may be powered by electric motor means or hydraulic means, for example. The magazine accessor 815 may, for example, be movably mounted on a rail by the computer medium library 800, such that the magazine accessor 815 can be positioned in any desirable position along a direction of the rail. The rail may engage gliding tracks substantially perpendicular to the direction of the rail, such that the rail can be moved along a direction of the gliding tracks to any desired position. By the movement of the magazine accessor 815 on the rail and by the movement of the rail along the gliding tracks, the magazine accessor 815 can be positioned adjacent any one of the medium magazines 807. The magazine accessor 815 may have an identification detector to detect the identity of a particular medium magazine 807. Many different identification detectors may be used with embodiments of the invention. For example, a bar code reader on the magazine accessor 815 can detect individual bar codes on the medium magazines 807.

The devices 801 and the magazine accessor 815 may be controlled by a library controller 817. The library controller 817 may also be located in the library 800. The library controller 817 includes logic and can perform an algorithm suitable for the application. The library controller 817 can, for example, control the magazine accessor 815 to locate one of the magazines 807, move it, and bring it into connection with one of the devices 801. The library controller 817 may for example be able to update checksums, or it may include instructions for causing the processors 804 to update a checksum in accordance with the invention.

A controller 805 is connected to the library controller 817. The controller 805 can, for example, cause the library controller 817 to perform the sequence of controlling the magazine accessor 815 to locate and identify a particular magazine 807 in the array 813, relocate the magazine 807 to one of the devices 801, and cause the device 801 to read or write information on the computer medium in the magazine 807. The controller may for example be able to update checksums for the data structures in the magazines 807, or it may include instructions for causing the processors 804 to update a checksum in accordance with the invention. The controller 805 has a user interface, whereby the controller 805 can input and output information and a user of the computer medium library 800 can cause operations to be carried out by the library 800.

If a data structure on the computer readable and writeable medium in one of the magazines 807 is changed, a new checksum must be calculated for that data structure. The processor 804 may update the checksum of the data structure in accordance with the invention, and the magazine accessor 815 may thereafter relocate the magazine 807 to the array 813. Magazines 807 may be inserted in more than one of the devices 801 at the same time. For example, while one of the devices 801 is reading or writing information on the storage medium in one of the magazines 807, another one of the devices 801 may be reading and/or writing information on another magazine 807, and at the same time a third magazine 807 may be in the process of being relocated between the array 813 and the devices 801.

In using embodiments of the invention, checksums of data structures are updated by recalculating the word values only for the words changed since the last checksum was calculated. This may be a faster way of updating the checksum, since a substantial amount of the data structure may not have been altered by the changes and time may be saved by not recalculating the word values for those parts of the data structure.

The foregoing description of exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of updating a checksum of a data structure, wherein the checksum has an additive property, the method comprising:
    eliminating from the checksum a word value of a word that is to be modified, to form a current checksum; and
    updating the current checksum with a modified word value of a modified word, to form an updated checksum.

2. The method of claim 1, further including the step of verifying the data structure before the step of eliminating the word value.

3. The method of claim 2, wherein the step of verifying the data structure includes the steps of
    calculating a new checksum for the data structure; and
    adding it to the checksum.

4. The method of claim 1, further including the step of identifying the word value of the word that is to be modified.

5. The method of claim 1, further including the step of modifying the word that is to be modified to form the modified word.

6. The method of claim 1, further including the step of calculating the checksum for the data structure before the step of eliminating the word value.

7. The method of claim 6, wherein calculating the checksum includes the step of subtracting from zero.

8. The method of claim 6, wherein the step of eliminating the word value includes the step of adding the word value to the checksum.

9. The method of claim 6, wherein the step of updating the current checksum includes the step of subtracting the word value from the current checksum.

10. The method of claim 6, wherein the step of calculating the checksum for the data structure includes the steps of:
    a) setting the checksum to zero;
    b) dividing the data structure into words; and
    c) adding a constant and a value of a word to the checksum.

11. The method of claim 10, further including repeating step c) throughout the data structure.

12. An article of manufacture comprising a computer readable medium having instructions for causing a computer to perform a method comprising the steps of:
    eliminating from a checksum a word value of a word that is to be modified, to form a current checksum; and
    updating the current checksum with a modified word value of a modified word, to form an updated checksum.

13. The article of manufacture of claim 12, wherein the computer readable medium further has instructions for causing the computer to perform the step of verifying the data structure before the step of eliminating the word value.

14. The article of manufacture of claim 13, wherein the step of verifying the data structure includes the steps of
    calculating a new checksum for the data structure; and
    adding it to the checksum.

15. The article of manufacture of claim 12, wherein the computer readable medium further has instructions for causing the computer to perform the step of identifying the word value of the word that is to be modified.

16. The article of manufacture of claim 12, wherein the computer readable medium further has instructions for causing the computer to perform the step of modifying the word that is to be modified to form the modified word.

17. The article of manufacture of claim 12, wherein the computer readable medium further has instructions for causing the computer to perform the step of calculating the checksum for the data structure before the step of eliminating the word value.

18. The article of manufacture of claim 17, wherein calculating the checksum includes the step of subtracting from zero.

19. The article of manufacture of claim 17, wherein the step of eliminating the word value includes the step of adding the word value to the checksum.

20. The article of manufacture of claim 17, wherein the step of updating the current checksum includes the step of subtracting the word value from the current checksum.

21. The article of manufacture of claim 17, wherein the step of calculating the checksum for the data structure includes the steps of:
    a) setting the checksum to zero;
    b) dividing the data structure into words; and
    c) adding a constant and a value of a word to the checksum.

22. A system for data structures comprising:

a storage medium comprising at least one data structure; and a processor capable of accessing the computer readable and writeable medium, wherein the processor eliminates from a checksum a word value of a word that is to be modified, to form a current checksum and updates the current checksum with a modified word value of a modified word, to form an updated checksum.

23. The system of claim 22, wherein the processor further verifies the data structure before eliminating the word value.

24. The system of claim 23, wherein the processor calculates a new checksum for the data structure, and adds it to the checksum in verifying the data structure.

25. The system of claim 22, wherein the processor further identifies the word value of the word that is to be modified.

26. The system of claim 22, wherein the processor further modifies the word that is to be modified to form the modified word.

27. The system of claim 22, wherein the processor further calculates the checksum for the data structure before eliminating the word value.

28. The system of claim 27, wherein the processor subtracts from zero in calculating the checksum.

29. The system of claim 27, wherein the processor adds the word value to the checksum in eliminating the word value.

30. The system of claim 27, wherein the processor subtracts the word value from the current checksum in updating the current checksum.

31. The system of claim 27, wherein the processor sets the checksum to zero, divides the data structure into words and adds a constant and a value of a word to the checksum, in calculating the checksum for the data structure.

32. The system of claim 22, further comprising an accessor for providing access by the processor to the storage medium.

33. The system of claim 32, further comprising a controller including logic for controlling the processor and the accessor.

34. The system of claim 32, wherein the accessor comprises a medium storage unit relocator for relocating medium storage units.

35. The system of claim 22, wherein the processor is located in a tape drive unit.

36. A data access device for reading and writing information on magnetic tape, the device comprising;

a storage medium comprising at least one data structure;

a processor including logic capable of reading and writing information on the storage medium, wherein the processor identifies a word value of a word that is to be modified in the data structure, eliminates the word value from a stored checksum, to form a current checksum, modifies the word to form a modified word; and forms a new checksum by updating the current checksum with a modified word value of the modified word.

37. A tape library for storing, reading and writing information on magnetic tape, the tape library comprising;

magnetic tape comprising at least one data structure, the magnetic tape being stored in at least one medium magazine in the tape library;

an accessor for bringing the medium magazines into connection with at least one processor for reading and writing information on the magnetic tape, wherein the processor identifies a word value of a word that is to be modified in the data structure, eliminates the word value from a stored checksum, to form a current checksum, modifies the word to form a modified word and forms a new checksum by updating the current checksum with a modified word value of the modified word.

* * * * *